United States Patent
Gilliland et al.

[19]

[11] Patent Number: 6,160,647
[45] Date of Patent: Dec. 12, 2000

[54] OPTOELECTRONIC TRANSMITTER WITH IMPROVED CONTROL CIRCUIT AND LASER FAULT LATCHING

[75] Inventors: Patrick B. Gilliland; Evgueniy Anguelov, both of Chicago, Ill.

[73] Assignee: Stratos Lightwave, Inc., Chicago, Ill.

[21] Appl. No.: 08/904,130

[22] Filed: Aug. 9, 1997

[51] Int. Cl.[7] .............................. H04B 10/00; H04B 10/04
[52] U.S. Cl. ........................ 359/110; 359/152; 359/153; 359/163; 359/187
[58] Field of Search ..................................... 359/152, 163, 359/187, 154, 145; 385/14; 257/81, 83, 84

[56] References Cited

U.S. PATENT DOCUMENTS

| | | | |
|---|---|---|---|
| 4,208,621 | 6/1980 | Hipkins et al. | 318/138 |
| 5,402,433 | 3/1995 | Stiscia | 372/31 |
| 5,479,288 | 12/1995 | Ishizuka et al. | 359/163 |
| 5,535,034 | 7/1996 | Taniguchi | 359/152 |
| 5,561,727 | 10/1996 | Akita et al. | 385/88 |
| 5,714,746 | 2/1998 | Dvorkis et al. | 235/472 |
| 5,999,294 | 12/1999 | Petsko | 359/145 |

*Primary Examiner*—Leslie Pascal
*Assistant Examiner*—Dalzid Singh
*Attorney, Agent, or Firm*—David L. Newman; Steven M. Evans

[57] ABSTRACT

An optoelectronic transmitter is provided including a semiconductor laser as the active optical transmitting element. The transmitter includes first and second printed circuit boards, with the first printed circuit board having mounted thereon electronic components and circuitry for driving the optoelectronic transmitter. A transmitting optical subassembly (TOSA) is mounted to the second printed circuit board. The second printed circuit board has an array of solder pads disposed on the back surface thereof, and the first printed circuit board has a corresponding array of solder pads disposed along an outer edge of the board. Spacing of the solder pads is such that when the first printed circuit board is placed in perpendicular abutment against the outer edge of the first printed circuit board, the solder pads formed on the first printed circuit board are aligned adjacent to the solder pads disposed on the back of the second printed circuit board. Solder joints are then formed in the angular space between the solder pads disposed on the first and second printed circuit boards, bonding the boards together while simultaneously providing electrical connections between the various components mounted on the individual printed circuit boards. An improved control circuit for driving the semiconductor laser transmitter facilitates this arrangement. The improved control circuit provides both automatic power control and laser slope compensation in order to normalize the output characteristics of individual transceivers. An alternate embodiment further includes a laser fault latching circuit for disabling the laser transmitter, and providing laser fault indication.

34 Claims, 6 Drawing Sheets

OPTOELECTRONIC TRANSMITTER WITH IMPROVED CONTROL CIRCUIT AND LASER FAULT LATCHING

BACKGROUND OF THE INVENTION

The present invention relates to an optoelectronic transmitter having an improved control circuit for driving a semiconductor laser. The transmitter disclosed herein may also be included with an optoelectronic transceiver which incorporates both an optical transmitter and an optical receiver for providing bidirectional data communication. A first embodiment provides Automatic Power Control and laser slope compensation in a small footprint transceiver package. A second embodiment also provides Automatic Power Control and laser slope compensation, but within a larger transceiver package. The larger package of the second embodiment allows for additional circuitry for providing laser fault latching. In both embodiments, the control circuit is configured such that all variable components associated with normalizing the output characteristics of the semiconductor laser may be mounted on a separate carrier printed circuit board apart from the remaining components, requiring only a small number of connection points between the main transceiver printed circuit board and the carrier printed circuit board. The invention further includes an improved technique for mounting a Transmitting Optical Sub-Assembly to the carrier printed circuit board, and attaching the carrier printed circuit board to the main transceiver printed circuit board at a 90° angle.

Optoelectronic transceivers are well known in the art. For example, a 1×9 package is a common small footprint transceiver housed in a compact, standardized modular package. Functionally, small footprint optoelectronic transceivers provide bidirectional data communication between an electronic host device and a pair of optical fibers. Binary voltage signals generated within the host device are input to the transceiver where they are converted into optical signals to be transmitted over a first optical fiber. On the receiver side, binary optical signals are received over a second optical fiber and converted to voltage signals which can be read by the host device. Physically the small footprint package generally comprises a horizontal printed circuit board with the electronic components necessary to drive the optical transmitter and receiver mounted thereon. Optical sub-assemblies including a Transmit Optical Sub-Assembly (TOSA) and a Receive Optical Sub-Assembly (ROSA) are mounted beside one another along one edge of the printed circuit board. The TOSA and ROSA provide the optical interface between the optical fibers and the small footprint transceiver package. The optical subassemblies are mounted such that the optical axis of both optical sub-assemblies are parallel with the plane of the main transceiver printed circuit board, pointing away from the transceiver package. An electrical connector comprising a single row of nine contact pins is mounted along the opposite edge of the printed circuit board, providing the electrical interface between the transceiver package and the host device.

A problem with prior art small footprint transceiver packages has been in mounting the TOSA and ROSA to the main transceiver printed circuit board. The TOSA and ROSA are generally cylindrical in shape, and in order for the optical axes of the subassemblies to be parallel with the printed circuit, the base of the subassemblies must be mounted perpendicular to the surface of the printed circuit board. The optical sub-assemblies must be somehow held firmly in place relative to the printed circuit board, and the electrical leads extending from the sub-assemblies must be securely and reliably bonded to the driver and receiver circuits formed on the main transceiver printed circuit board. For example, in U.S. Pat. No. 5,528,408, issued to McGinley, et al. and assigned to Methode Electronics, Inc., the TOSA, ROSA and main transceiver printed circuit board are all housed within an outer housing. The cylindrical bodies of the TOSA and ROSA are modified to mate with mounting structures formed within the housing. Likewise, the main transceiver printed circuit board is also held in place by additional mounting structures formed within the housing. The mounting structures are configured such that the printed circuit board is held in fixed horizontal relation below the TOSA and ROSA, with the optical axes of the TOSA and ROSA extending parallel to the surface of the main transceiver printed circuit board. Flexible leads extend out the back of the optical sub-assemblies and are formed and soldered to contacts on the printed circuit board. The rigid outer housing maintains the spatial relationship between the optical sub-assemblies and the printed circuit board, thereby alleviating stress on the electrical leads, and preventing the leads from breaking off.

Another solution to the optical sub-assembly mounting problem has been to mount the TOSA and ROSA on a separate printed circuit board connected to the main printed circuit board via flexible circuitry. The TOSA and ROSA are mounted to the second printed circuit board such that the optical axes of the optical sub-assemblies extend perpendicular to the surface of the second board. When the internal electronics are packaged within an outer housing, the flex circuitry is bent 90° so that the second printed circuit board sits perpendicular to the main printed circuit board, and the optical axes of the TOSA and ROSA extend parallel to the surface of the main board.

While both of the examples given above effectively solve the optical sub-assembly mounting problem, both solutions are expensive to implement and add cost to the final product. Among the improvements of the present invention is to provide an improved attachment mechanism for connecting the TOSA and ROSA to the main transceiver printed circuit board.

In addition to the physical mounting provisions of the TOSA and ROSA, the present invention also includes improvements to the control circuit for driving a semiconductor laser as the active optical element within the TOSA. In the past, most optoelectronic transceivers have employed LEDs as the active optical element within the TOSA. More recently, however, LEDs have been replaced by semiconductor lasers. The 5,528,408 Patent, for example, describes a Small Footprint Optoelectronic Transceiver with Laser. The 5,528,408 patent generally describes a small footprint package employing a semiconductor laser such as a Vertical Cavity Surface Emitting Laser (VCSEL) as the active optical element within the TOSA. Employing a semiconductor laser as the active optical element provides a number of advantages over LEDs, including improved coupling efficiency and higher data rates. On the other hand, employing a semiconductor laser gives rise to biasing problems not encountered with LEDs.

One of the primary difficulties with semiconductor lasers is that each individual laser has its own unique set of output characteristics. For example, FIG. 1 shows typical output power versus input current curves, or P-I curves, for three individual semiconductor lasers A, B and C. In FIG. 1, the X-axis represents the drive current input to the semiconductor laser, and the Y-axis represents the corresponding optical output power delivered by the laser. As can be seen, a uniform DC input current $I_Q$ supplied to each of the individual semiconductor lasers A, B and C results in a different amount of optical output power, $P_{QA}$, $P_{QB}$, and $P_{QC}$, being delivered by each of the semiconductor lasers. Furthermore, since the linear operating range for each semiconductor laser has a different slope, a given change in the input current $\pm\Delta I$ will cause a greater or lesser change in the output power $\pm\Delta P$ for each semiconductor laser. These variations in the slope efficiency of the various semiconductor lasers can also be seen in FIG. 1. The uniform DC operating current, or quiescent current, $I_Q$ is applied to each of the three semiconductor lasers A, B, and C, and an identical alternating current signal $I_{SIG}$ is superimposed thereon. $I_{SIG}$ causes a periodic change in the input current $+\Delta I$ above and below the quiescent current $I_Q$. The magnitude of the $\Delta I$ applied to each semiconductor laser in FIG. 1 is identical between the three semiconductor lasers A, B, and C. On the output side, however, where the resultant changes in the output power $\pm\Delta P_A$, $\pm\Delta P_B$ and $\pm\Delta P_C$ generated due to the changes in the input current, vary from one laser to the other. As is clear from the drawing, $\Delta P_A$ is greater than $\Delta P_B$, and $\Delta P_B$ is greater than $\Delta P_C$. These variations in the output characteristics of individual semiconductor lasers raise a significant barrier to designing a standard, reliable optoelectronic transceiver suitable for mass production.

Ideally, each optoelectronic transceiver of a particular design will have similar output characteristics. The optical output of the transceiver is to represent a binary data signal comprising a serial string of 1's and 0's. A binary 1 is transmitted when the optical output of the transmitter exceeds a certain power threshold, and a binary zero is transmitted when the optical output power of the transmitter falls below a certain power threshold. Maximizing the difference in transmitted power levels between 1's and 0's improves the reliability of the transceiver and improves the sensitivity of the receiver at the opposite end of the data link. Thus, in a transceiver design incorporating a semiconductor laser as the active optical element, the transceiver should include provisions for optimizing the output characteristics of the semiconductor laser. Furthermore, these output characteristics should be the same from one transceiver to another. Therefore, the optimizing circuitry should also normalize the output characteristics of the transceiver to a well-defined standard.

In generating the optical output signal, the transmitter driver circuit receives a binary voltage signal from the host device. The driver circuit converts the input voltage signal to a current signal which drives the semiconductor laser. A signal voltage corresponding to a binary 1 must be converted to a current supplied to the semiconductor laser sufficient to cause the semiconductor laser to radiate an optical output signal having an output power level above the power threshold corresponding to the transmission of a binary 1. Similarly, a signal voltage corresponding to a binary 0 must be converted to a current level supplied to the semiconductor laser which will cause the semiconductor laser to radiate an optical output signal having an output power level below the power threshold corresponding to the transmission of a binary 0. However, due to variations in the P-I characteristics from one semiconductor laser to another, the current levels necessary to produce the desired output power levels will vary depending on the individual characteristics of each individual semiconductor laser.

In general, variations in the P-I characteristics of individual semiconductor lasers can be compensated for by employing biasing and compensating resistors which shape the input current driving the semiconductor laser. By properly sizing the biasing and compensating resistors, the input current delivered to the laser can be manipulated so that the optical power emitted by the laser behaves in a predictable and beneficial manner. There are two components to the process of properly biasing the semiconductor laser. The first component, automatic power control (APC), involves establishing the average DC input current, or quiescent operating current $I_Q$. $I_Q$ establishes the average output power, or quiescent operating power $P_Q$ that will be radiated by the semiconductor laser. The second component, laser slope compensation, involves determining the amount of change in the input current, $\pm\Delta I$, necessary to effect the desired change in the output power $\pm\Delta P$ to distinguish between 1's and 0's transmitted by the transceiver.

APC and laser slope compensation are best described in conjunction with the P-I curves shown in FIG. 2. FIG. 2 shows the identical P-I curves for semiconductor lasers A, B, and C as shown as in FIG. 1. However, rather than applying the same input current to each device, diverse input currents $I_A$, $I_B$, and $I_C$ are applied to each semiconductor laser A, B, and C respectively, such that each laser emits approximately the same output power $P_Q$. The optical power signal transmitted by the transceiver alternates above and below the quiescent output power $P_Q$. Binary 1's are represented as $P_Q+\Delta P$, and binary 0's are represented as $P_Q-\Delta P$. The differences in power levels between 1's and 0's comprises the extinction ratio of the transmitter. A greater extinction ratio, meaning a greater difference in the output power levels between transmitted 1's and 0's, results in improved receiver sensitivity at the opposite end of the data link. Therefore, it is desirable to maximize $\Delta P$ in order to maximize the extinction ratio. To maximize $\Delta P$ it is best to establish a quiescent operating power $P_Q$ near the midpoint of the operating range of the semiconductor laser. Once $P_Q$ has been established, the extinction ratio can be maximized by setting $I_Q+\Delta P$ as near the maximum output level of the semiconductor laser as possible, and setting $I_Q-\Delta P$ as near the lasing power threshold of the semiconductor laser as possible.

As is clear from FIG. 2, the quiescent input current $I_Q$, necessary to achieve the same, or nearly the same, quiescent output power $P_Q$, will vary significantly depending on whether semiconductor laser A, B or C is employed. Automatic power control establishes the quiescent input current $I_Q$ so that the desired average output power $P_Q$ is radiated by the particular semiconductor laser employed in the transceiver. Thus, for the three semiconductor lasers A, B and C depicted in FIG. 2, the quiescent operating currents $I_{QA}$, $I_{QB}$, and $I_{QC}$ will each deliver an output power of approximately $P_Q$ from semiconductor lasers A, B, and C respectively. Determining the proper quiescent current $I_Q$ for a particular semiconductor laser involves individually testing the semiconductor laser and varying the input current supplied thereto until the desired output power is achieved. Once the quiescent current $I_Q$ has been determined, a bias circuit can be derived which supplies an average DC input current to the semiconductor laser equal to $I_Q$.

Once the quiescent current has been established, it is necessary to compensate for the varying slopes of the P-I curves for the various semiconductor lasers. Because the slope of each P-I curve is different, the magnitude of change in the input current $\Delta I$ necessary to cause a desired change in the output power $\Delta P$ will vary from one semiconductor laser to another. Referring again to the P-I curves of FIG. 2, an alternating current signal $I_{SIG}$ is superimposed on each of the quiescent currents $I_{QA}$, $I_{QB}$, and $I_{QC}$ supplied to each of the semiconductor lasers A, B, and C respectively. The peak magnitudes of the alternating current signals are represented by the quantities $\Delta I_A$, $\Delta I_B$, and $\Delta I_C$. Clearly, $\Delta I_C$ is greater than $\Delta I_B$ and $\Delta I_B$ is greater than $\Delta I_A$, yet for each semiconductor laser the corresponding change in the output power $\Delta P$ is approximately the same for each device. By controlling the peak magnitude of the input current signal $I_{SIG}$, the quantities $\Delta I_A$, $\Delta I_B$, and $\Delta I_C$ can be tailored to the specific slope characteristics of a particular semiconductor laser such that the peak change in the output power $\Delta P$ can be set at or near the operating limits of the particular semiconductor laser. Maximizing $\Delta P$ maximizes the extinction ratio, thereby optimizing the performance of the transceiver.

Since the binary signals to be transmitted by the transceiver are optical representations of a voltage signal received from the host device, the driver circuit must convert the received voltage signal into the alternating current signal $I_{SIG}$ and superimpose $I_{SIG}$ onto the DC quiescent current $I_Q$. In tailoring the AC current signal to a particular semiconductor laser, the laser slope compensation circuit establishes the peak magnitude of $I_{SIG}$ resulting from changes in the input voltage signal. The slope compensated AC drive current $I_{SIG}$ will vary between $I_Q+\Delta I$ and $I_Q-\Delta I$, where $I_Q$ and $\Delta I$ have been calculated to provide the maximum extinction ratio possible for the particular laser employed. Thus, for example, if semiconductor laser B of FIG. 2 is employed, the slope compensation circuit must supply $I_{SIGB}$ having peak values of $I_{QB}+\Delta I_B$ and $I_{QB}-\Delta I_B$, where the quantity $\pm\Delta I_B$ has been calculated to maximize the change in output power $\Delta P$ of semiconductor laser B.

APC and laser slope compensation are generally accomplished through biasing and compensating resistors included within the driver circuit. When the required quiescent current $I_Q$ and the proper magnitude of the slope compensated current signal $I_{SIG}$ have been determined, the biasing and compensating resistors can be sized so that the driver circuit supplies the proper current signal to the semiconductor laser. APC and laser slope compensation help to normalize the output characteristics of the optoelectronic transceiver so that individual transceivers may be used interchangeably without having a noticeable effect on the overall data communication system.

A problem with implementing APC and laser slope compensation, however, is that they complicate the manufacturing process and add cost to the final transceiver product. Individually testing the output characteristics of each semiconductor laser is time consuming and expensive. Individually calculating the size of each biasing and compensating resistor to optimize the output characteristics of each device is expensive as well. What is more, having individualized components prevents the main transceiver printed circuit boards from being manufactured in a completely automated fashion. Instead, individual resistors must be sized and soldered in place by hand, once again adding time and cost to the manufacturing process. Therefore, a less expensive method is desired for providing APC and laser slope compensation in optoelectronic transceiver modules where semiconductor lasers are employed as the active optical element.

In addition to APC and laser slope compensation, in some applications it is also advantageous to monitor the output power emitted by the semiconductor laser to ensure that the laser is operating within safe limits. Because the optical energy emitted by a semiconductor laser has the potential to be harmful to the eyes if transmitted with sufficient power, it is prudent to provide a mechanism for disabling the laser when the output of the laser exceeds safe operating levels. Such a mechanism should prevent the drive current from reaching the laser, and should provide a signal to the host device indicating that a laser fault has occurred.

In general, the present invention provides an improved optoelectronic transmitter having an improved mechanism for attaching a TOSA at a right angle to the edge of a main transmitter printed circuit board. The present invention further provides an optoelectronic transmitter package employing a semiconductor laser as the active optical element and wherein an improved control circuit includes components which can be divided between at least two printed circuit boards, requiring only a minimal number of electrical connections therebetween. The improved control circuit must be configured such that all of the variable components associated with APC and laser slope compensation can be mounted on a separate carrier printed circuit board along with a TOSA, and all of the standardized components which will not vary from one transceiver to another can all be mounted together on the main transceiver printed circuit board. Removing the variable components from the main transceiver printed circuit board facilitates mass production of the main transceiver printed circuit boards by allowing the use of high speed automated techniques. Placing the variable biasing components on a separate carrier printed circuit board with the TOSA further allows easier testing of the output characteristics of the semiconductor laser within the TOSA and tailoring the biasing components to normalize the performance of the laser. In this way an efficient procedure may be established for testing the output characteristics of large numbers of semiconductor lasers and individually sizing and installing the biasing and compensating components. In a final step of the assembly process, the mass produced main transceiver printed circuit boards may be connected to any of the individually normalized TOSA assemblies, to complete the construction of an improved optoelectronic transceiver.

SUMMARY OF THE INVENTION

In light of the background described above, one of the main objectives of the present invention is to provide an improved optoelectronic transmitter employing a semiconductor laser as the active optical element.

A further object of the present invention is to provide an improved optoelectronic transceiver wherein a TOSA and a ROSA are each mounted on individual carrier printed circuit boards which are attached at approximately a 90° angle to a first, main transceiver printed circuit board.

Another objective of the present invention is to provide a small footprint optoelectronic transmitter employing a semiconductor laser as the active optical element, and having an improved control circuit providing Automatic Power Control (APC) and laser slope compensation.

Still another objective of the present invention is to provide an improved control circuit for a optoelectronic transmitter wherein APC and laser slope compensation are provided by biasing and compensating resistors individually tailored to the specific semiconductor laser employed within the transmitter.

A further objective of the present invention is to provide an improved optoelectronic transmitter employing a semiconductor laser as the active optical element wherein the biasing and compensating components providing APC and Laser Slope Compensation are mounted on a separate carrier printed circuit board with the TOSA such that the output characteristics of the semiconductor laser can be optimized independently from the main transceiver printed circuit board.

An additional objective of the present invention is to provide an improved optoelectronic transceiver having a main transceiver printed circuit board on which all standardized electronic components are mounted, allowing for automated mass production of the main transceiver printed circuit board.

A still further objective of the present invention is to provide an improved optoelectronic transmitter employing a semiconductor laser as the active optical element, wherein a TOSA is mounted on a separate carrier printed circuit board, the carrier printed circuit board also including biasing and compensating components sized to optimize the performance of the particular semiconductor laser within the TOSA.

And still another objective of the present invention is to provide an improved optoelectronic transmitter employing a semiconductor laser as the active optical element wherein the output power of the transmitter is monitored and the semiconductor laser is disabled when the output power exceeds a predetermined safety threshold.

All of these objectives, as well as others that will become apparent upon reading the detailed description of the presently preferred embodiments of the invention, are met by the Optoelectronic Transmitter With Improved Control Circuit And Laser Fault Latching herein disclosed.

The present invention relates to optoelectronic transmitters employing a semiconductor laser as the active optical element. The transmitters herein disclosed are commonly included in transceiver packages which include both transmitting and receiving components. Therefore, the following discussion concentrates on optoelectronic transceivers, however it must be noted that the improvements disclosed may be practiced on optical transmitters which are packaged without an accompanying receiver. An optoelectronic transceiver according to the present invention generally comprises a first main transceiver printed circuit board which contains the majority of the electronic components necessary for the operation of the transceiver. A Transmitting Optical Sub-Assembly (TOSA) and a Receiving Optical Sub-Assembly (ROSA), are each mounted on separate carrier printed circuit boards which can be attached perpendicularly to the first main transceiver printed circuit board such that the optical axes of both the TOSA and the ROSA extend parallel to the surface of the first main transceiver printed circuit board. The invention includes an improved control circuit which provides Automatic Power Control (APC) and laser slope compensation. Both of these functions are provided by various biasing and compensating resistors which can be individually sized in order to normalize the output characteristics of a particular semiconductor laser. The improved control circuit is configured such that the biasing and compensating resistors can be mounted separate from the first main transceiver printed circuit board on the same carrier printed circuit board on which the TOSA is mounted. Mounting the biasing and compensating resistors remotely allows the main transceiver printed circuit board to be manufactured using only standard components, thereby facilitating mass production of the boards. Meanwhile, on the second carrier printed circuit board containing the TOSA, the biasing and compensating resistors can be individually tailored to the particular semiconductor laser mounted within the TOSA. Either discrete resistor or polymer thick film resistors may be employed. Polymer thick film resistors have the advantage that the semiconductor laser can be actively tested while the polymer thick film resistors are laser trimmed. Using this technique, the biasing and compensating resistors can be sized and installed in a single process step, thereby reducing the manufacturing cost of the device. Employing discrete resistors, on the other hand, the semiconductor laser must be tested separately, the size of the bias resistor calculated, and discrete resistors soldered in place. Once the biasing resistors have been properly sized and installed, the second carrier printed circuit board with the TOSA and biasing resistors mounted thereon can be joined to the main transceiver printed circuit board to complete the transceiver assembly. Connection points between components mounted on the main transceiver printed circuit board and those mounted on the second carrier printed circuit board are pre-aligned so that when the two boards are abutted against one another at approximately a 90° angle, the connection points line up against one another and may be soldered together with a fillet shaped solder joint.

As for the transceiver package itself, a first embodiment comprises a small footprint transceiver such as a 1×9 package. 1×9 transceiver packages are well known in the art and provide a standardized small footprint transceiver package. The 1×9 includes a single row of nine contact pins which act as the electrical interface to a host device, and an SC-Duplex fiber optic receptacle for receiving an SC-Duplex fiber optic connector, forming the interface with the fiber optic transfer medium. In the present invention, a control circuit for a small footprint transceiver such as a 1×9 includes both APC and laser slope compensation.

A second embodiment of an improved transceiver package according to the present invention comprises an extender module employing a DB-9 connector as the interface with the host device. The control circuit for this embodiment includes a laser fault latching feature. The laser fault latching feature monitors the output power of the semiconductor laser and generates a fault when the output power exceeds a predetermined level. When an excess power fault is detected, the fault latching circuit disables the laser and sends a fault signal to the host device. The laser fault latching feature further includes fault reset and safe power up circuitry. The reset circuitry allows the fault to be cleared in a safe manner such that the optical output of the semiconductor laser does not exceed safe operating levels. The power up circuitry disables the laser while determining the status of the control circuit. Once the integrity of the circuit has been determined, the laser is enabled. This feature allows for hot pluggability of the transceiver module so that the module may be safely installed in a system while the system is already operating.

DETAILED DESCRIPTION OF THE PRESENTLY PREFERRED EMBODIMENTS

The present invention is for improvements to optoelectronic transceivers employing semiconductor lasers as the active optical element. Improvements include an enhanced control circuit for providing Automatic Power Control (APC) and Laser Slope Compensation to compensate for the varying output characteristics between individual semiconductor lasers. The improved control circuit allows biasing and compensating components to be mounted remote from a main transceiver printed circuit board, thereby greatly improving the ability to mass produce the main board. In addition to the improved control circuit, the invention also provides an improved method for attaching a Transmitting Optical Sub-Assembly (TOSA) to the main transceiver printed circuit board which also facilitates the manufacturability of the transceiver. A second embodiment of the invention includes all features of the first embodiment, but also includes an additional laser fault latching circuit. The fault latching circuit monitors the output power of the laser and disables the laser if the output power exceeds a preset power limit. The laser fault circuit latches the fault so that the laser remains disabled until the fault condition is cleared and the circuit is reset.

Figure 3:
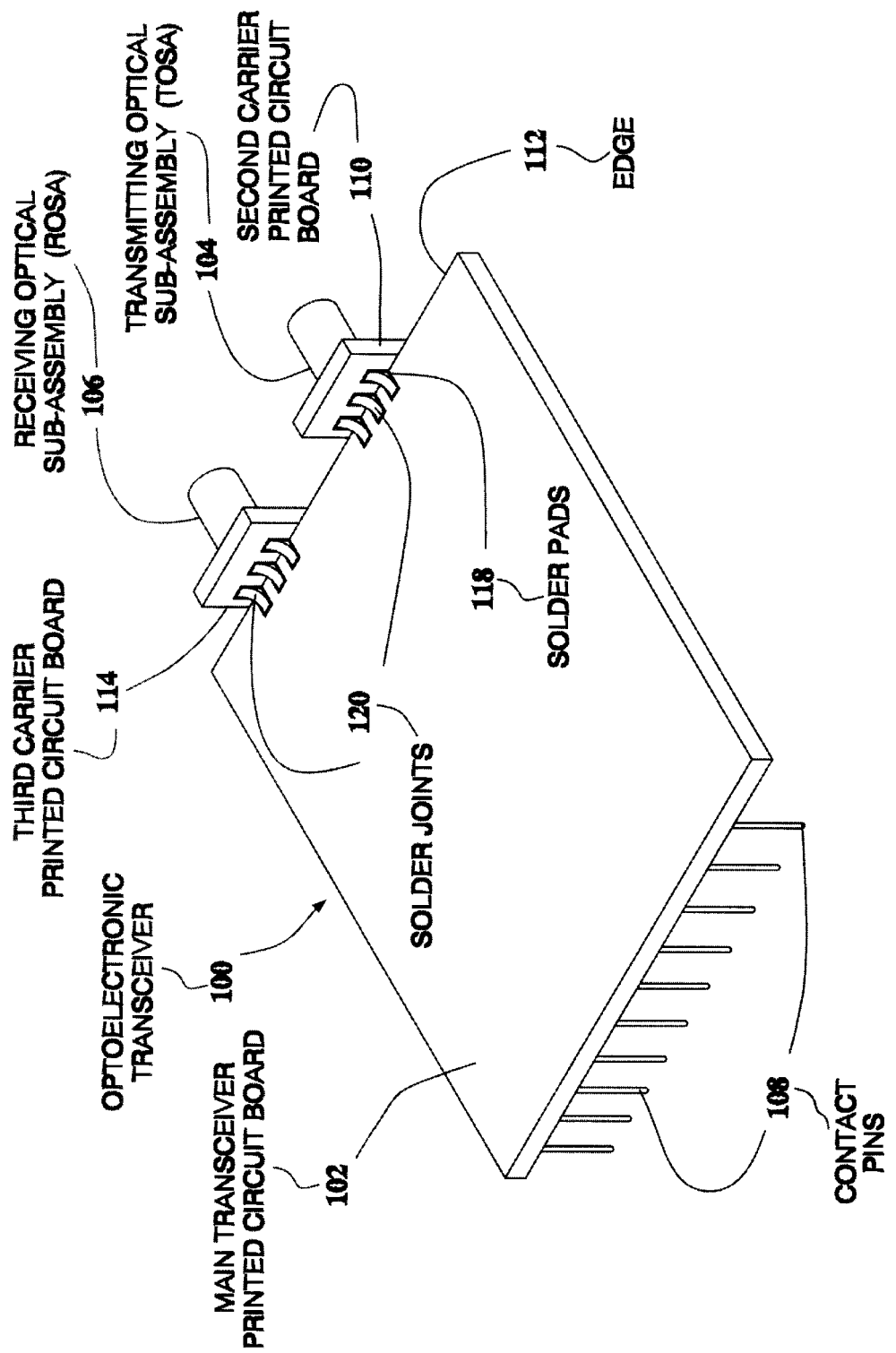
FIG. 3 is a perspective view of a small footprint transceiver package according to the present invention showing the Transmitting Optical Sub-Assembly and a Receiver Optical Sub-Assembly mounted to separate carrier printed circuit boards, and the separate carrier printed circuit board mounted approximately 90° to the main transceiver printed circuit board.

Referring to FIG. 3, an optoelectronic transceiver according to the present invention is shown 100. The Transceiver depicted in FIG. 3 corresponds to a small footprint transceiver package and includes a first main transceiver printed circuit board 102, a Transmitting Optical Sub-Assembly (TOSA) 104, and a Receiving Optical Sub-Assembly (ROSA) 106. The small footprint package shown is configured to mount directly to another printed circuit board (not shown), however, alternate mounting arrangements are possible. A single row array of contact pins 108 act as the interface between the host printed circuit board and the small footprint transceiver package. The 1×9 transceiver package is one of the preferred packages for the present invention, however, the improvements disclosed herein are not limited to 1×9 transceiver packages. For example, a second embodiment is set forth below wherein an optoelectronic transceiver is housed within an external extender housing which interfaces with a host device through a DB-9 connector. In the transceiver of the second embodiment the main transceiver printed circuit board 102 is expanded to include additional circuit features as set forth below. Other than the larger printed circuit board and additional circuit features of the second embodiment, the two embodiments are the same. For example, in each embodiment the TOSA 104 is mounted to a second carrier printed circuit board 110, which is mounted along an edge 112 of the main transceiver printed circuit board 102, perpendicular to the horizontal plane defined by printed circuit board 102. The ROSA 106 is mounted in similar fashion to a third carrier printed circuit board 114 which is attached to the same edge 112 of horizontal printed circuit board 102 adjacent the second carrier printed circuit board 110. With this arrangement, the TOSA 104 and ROSA 106 extend from their respective carrier circuit boards 110, 114 such that the optical axis of each sub-assembly points away from the main transceiver printed circuit board 102 generally parallel to the horizontal surface thereof.

Figure 4:
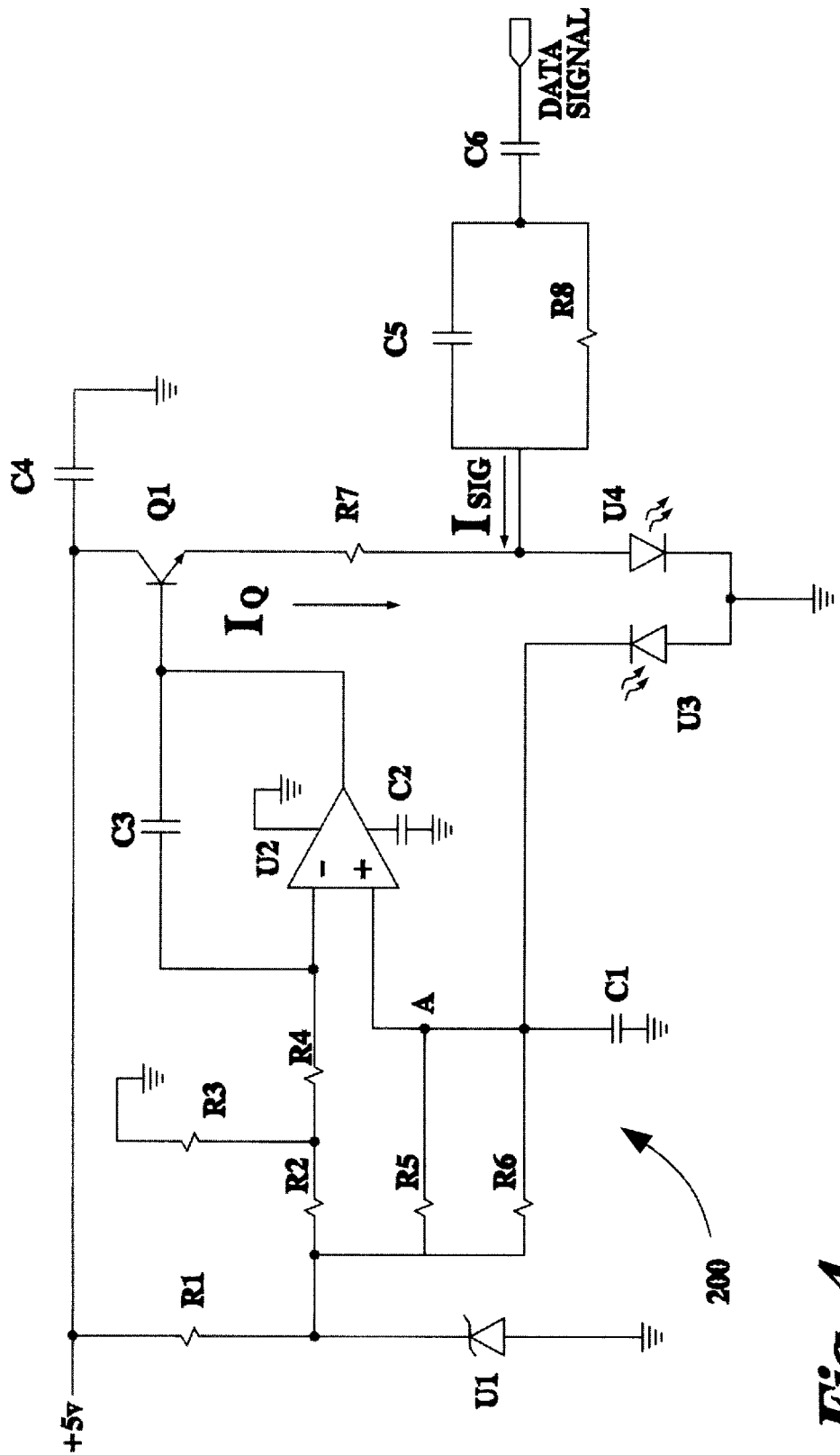
FIG. 4 is a schematic diagram showing an improved control circuit according to a first embodiment of the invention.

Referring now to FIG. 4, a control circuit 200 according to the first embodiment of the invention is shown. Control circuit 200 is configured to drive semiconductor laser $U_4$, supplying an input current comprising a DC quiescent component $I_Q$ and an AC component $I_{SIG}$. The optical output power delivered by semiconductor laser $U_4$ is directly proportional to the drive current supplied to the laser. As can be seen from the circuit diagram, the DC component $I_Q$ is sourced through transistor $Q_1$, and limited by resistor $R_7$. The AC component $I_{SIG}$ is supplied by the host device through the slope compensation circuit comprising capacitors $C_5$ and $C_6$ and resistor $R_8$. The slope compensation circuit converts an emitter coupled logic (ECL) voltage signal supplied by the host device to the AC current signal $I_{SIG}$.

APC involves setting the DC component of the drive current at a level which causes the semiconductor laser to emit a desired average output power $P_Q$. Once established, the quiescent output power $P_Q$ must be monitored and the drive current $I_Q$ continually adjusted so that the output power $P_Q$ remains stable. As noted, Transistor $Q_1$ sources the quiescent current $I_Q$. The current flowing from the emitter of $Q_1$ to semiconductor laser $U_4$ is directly proportional to the base voltage applied to $Q_1$. Thus, the quiescent drive current $I_Q$ and ultimately the quiescent output power $P_Q$ delivered by semiconductor laser $U_4$, can be set by controlling the base voltage applied to $Q_1$.

The base voltage applied to $Q_1$ is supplied by the output of operational amplifier $U_2$. $U_2$ compares a feedback voltage against a reference voltage and amplifies the voltage difference between the two. Thus, the base voltage applied to $Q_1$ is determined by the voltage difference between the established reference voltage and the feedback voltage. The reference voltage is applied to the inverting terminal of $U_2$, and is established as follows. Resistor $R_1$ and reference diode $U_1$ provide a regulated 2.5 V reference. The regulated 2.5 V reference supplies both the operational amplifier (op amp) reference circuit, and the feedback circuit. Within the reference circuit, a voltage divider is created between resistors $R_2$ and $R_3$. $R_2$ and $R_3$ are both precision 1 kΩ resistors, so that the 2.5 V reference is split evenly between the two resistors, establishing a reference voltage of 1.25 V therebetween. The 1.25 V reference is connected across resistor $R_4$, and input to the inverting terminal of operational amplifier $U_2$. Because of the nearly infinite input impedance of $U_2$, only a negligible current flows through $R_4$, creating a similarly negligible voltage drop thereacross, so that for all practical purposes the full 1.25 V reference is applied to the inverting terminal of $U_2$.

As with the reference voltage circuit, the feedback circuit is also supplied by the regulated 2.5 V reference established by $R_1$ and $U_1$. Resistors $R_5$ and $R_6$ are connected in parallel between the 2.5 V reference and the non-inverting terminal of $U_2$. The non-inverting terminal of $U_2$ is also connected to photodiode $U_3$. Only negligible current flows into the non-inverting terminal of $U_2$, so that any significant voltage drop across $R_5$ and $R_6$ will be the result of the reverse current flowing through photodiode $U_3$. Photodiode $U_3$ is mounted within the TOSA along with semiconductor laser $U_4$. Internally, the TOSA is arranged such that a percentage of the optical output of laser $U_4$ will be directed against photodiode $U_3$. The optical radiation striking $U_3$ modulates the reverse current through photodiode $U_3$ such that increased energy striking $U_3$ increases the feedback current flowing through resistors $R_5$ and $R_6$. Since the optical power striking $U_3$ is proportional to the optical power emitted by semiconductor laser $U_4$, the feedback voltage drop across resistors $R_5$ and $R_6$ is itself proportional to the optical power emitted by semiconductor $U_4$. The voltage drop across $R_5 R_6$ is subtracted from the 2.5 V reference which supplies the feedback circuit, to create a negative feedback reference voltage at node A. In addition to being connected to resistors $R_5$ and $R_6$, node A is also connected to the non-inverting terminal of $U_2$, thus, the negative feedback reference voltage is compared against the 1.25 V reference voltage applied to the inverting terminal of $U_2$. As the optical power striking $U_3$ increases, the reverse current flow through $U_3$ increases, and therefore the voltage drop across $R_5$ and $R_6$ increases as well. As the voltage drop across $R_5$ and $R_6$ increases, the voltage present at node A decreases, thereby reducing the output voltage of $U_2$, which reduces the current supplied to the semiconductor laser $U_4$ through transistor $Q_1$. The reduced current to the laser reduces the output power emitted by the laser, and thus a negative feedback loop is established.

Control circuit 200 provides APC by continually monitoring the optical power emitted by $U_4$, and continually adjusting the base voltage applied to transistor $Q_1$ to supply either more or less DC drive current to the laser $U_4$ in order to stabilize the output power of the laser. Minor deviations in the voltage applied to the inverting and non-inverting terminals of $U_2$ will result in larger voltage swings in the base voltage applied to transistor $Q_1$, and the changes in the base voltage will alter the current flow through $Q_1$ to semiconductor laser $U_4$. Since the voltage applied to the inverting terminal of $U_2$ is fixed, any deviation in the input voltages applied to $U_2$ will result from changes in the negative feedback voltage present at node A, and connected to the non-inverting terminal of $U_2$. As noted above, the negative feedback voltage present at node A is inversely proportional to the optical power emitted by semiconductor $U_4$. When only a small amount of optical energy is striking photodiode $U_3$, indicating very weak laser output signal, only a small current flows through the feedback circuit and there is only a small voltage drop across $R_5$ and $R_6$ so that the voltage at node A is closer to the +2.5 V reference which supplies the feedback circuit. On the other hand, when a large amount of optical energy strikes $U_3$, indicating a strong laser output signal, a larger current flows through the feedback circuit and there is a relatively large voltage drop across $R_5$ and $R_6$. In this case the voltage at node A will be lower, moving toward to 0 V. As these voltage fluctuations occur on the non-inverting terminal of operational amplifier $U_2$, $U_2$ amplifies the voltage difference between the reference voltage and the negative feedback voltage present at node A, and the amplified output voltage is applied to the base of transistor $Q_1$. The changing base voltage applied to $Q_1$ acts to increase or decrease the current flow to semiconductor laser $U_4$, thereby changing the output power of the optical signal emitted by $U_4$. Under steady state conditions the feedback current is such that the voltage drop across $R_5$ and $R_6$ results in exactly 1.25 V at node A. Thus, the voltage applied to the non-inverting terminal of $U_2$ exactly matches the 1.25 V reference applied at the inverting terminal of $U_2$. Under these conditions the base voltage to transistor $Q_1$ remains steady so that the DC drive current supplied to the semiconductor laser $U_4$ remains unchanged. The frequency response of the negative feedback loop is established by Resistor $R_4$ and capacitor $C_3$. In the integrating op amp configuration established by $R_4$, $C_3$ and $U_2$, the time constant of the feedback loop is established by $R_4$ and $C_3$.

Control circuit 200 automatically forces the laser output power into a steady state condition. If excessive power is emitted by the semiconductor laser $U_4$, photodiode $U_3$ immediately increases the current flow through resistors $R_5$ and $R_6$. The corresponding voltage drop across the resistors is increased, thereby reducing the voltage at node A and applied to the non-inverting terminal of $U_2$. Lowering the applied voltage to the non-inverting terminal of $U_2$ lowers the output voltage of $U_2$. Since the output of $U_2$ drives the base of transistor $Q_1$, the diminished output voltage of $U_2$ lowers the base voltage applied to $Q_1$. Decreasing the base voltage decreases the DC drive current flowing through $Q_1$ to semiconductor laser $U_4$. Less DC drive current into the laser results in less optical power out of the laser. As the output power of the laser decreases, less optical energy strikes the photodiode $U_3$. Less optical energy striking the photodiode $U_3$ reduces the feedback current flowing through resistors $R_5$ and $R_6$ such that the voltage drop across $R_5$ and $R_6$ decreases, and the voltage at node A and applied to the non-inverting terminal of $U_2$ increases. Increasing the voltage applied to the non-inverting terminal of $U_2$ increases the output voltage of $U_2$ as well, thereby increasing the base voltage applied to transistor $Q_1$. Increasing the base voltage to $Q_1$ increases the DC drive current supplied through $Q_1$ to semiconductor laser $U_4$, increasing the optical power emitted by the laser. And so the process repeats itself, until very quickly a steady state condition is reached where the DC drive current supplied to semiconductor laser $U_4$ remains constant, and the output power emitted by the semiconductor laser, following the DC drive current, likewise remains constant. The input current generated under these steady state conditions represents the quiescent operating current $I_Q$, and the optical output power emitted under steady state conditions represents the quiescent output power $P_Q$.

By changing the size of resistors $R_5$ and $R_6$, the values of $I_q$ and $P_Q$ can be set to any value within the operating range of the semiconductor laser. Optimally, $P_Q$ should be set midway between the minimum and maximum power levels of semiconductor laser $U_4$. This allows for the greatest power swings both above and below $P_Q$, depending on whether a 1 or a 0 is being transmitted. The large power swings establish the largest possible extinction ratio, thereby improving the sensitivity of the system. Changing the size of $R_5$ and $R_6$ changes the feedback voltage drop across the resistors for a given level of reverse current through photodiode $U_3$. When the size of $R_5$ and $R_6$ is increased, less feedback current is necessary to achieve the steady state voltage drop of 1.25 V across $R_5$ and $R_6$. Similarly, by reducing the size of $R_5$ and $R_6$ more feedback current is necessary to achieve the steady state voltage drop of 1.25 V across $R_5$ and $R_6$. Since the reverse current through $U_3$ is directly related to the amount of optical power emitted from semiconductor $U_4$, larger feedback resistors $R_5$ and $R_6$, require less optical power to reach steady state conditions. Similarly, smaller feedback resistors $R_5$ and $R_6$ require more optical power to reach steady state conditions. In other words, there is an inverse relationship between the quiescent output power $P_Q$ of semiconductor laser $U_4$ and the size of resistors $R_5$ and $R_6$.

Figure 1:
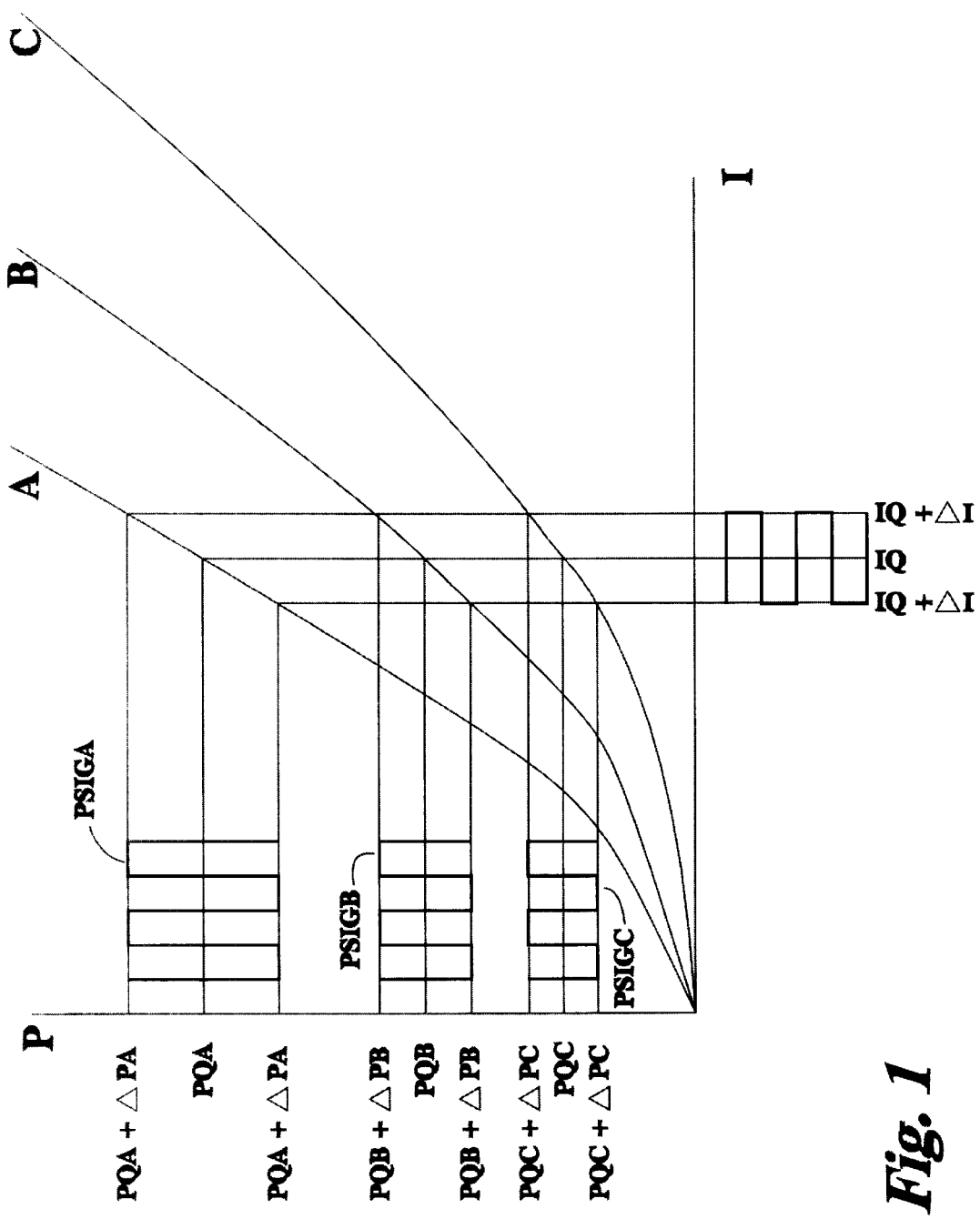
FIG. 1 is a graph of the output characteristics, or P-I curves, of three individual semiconductor lasers, each having the same input current signal $I_{SIG}$ applied thereto, and wherein the X axis represents the input current supplied to the lasers, and the Y axis represents the optical output power delivered by the semiconductor lasers.

Once the quiescent current has been established, it is necessary to compensate for variations in the slope characteristics of individual semiconductor lasers. Turning back to FIGS. 1 and 2, as well as FIG. 4, it is clear that the output power of the semiconductor laser is determined by the input drive current supplied to the laser. Furthermore, variations in the drive current will cause variations in the output power. In transmitting binary signals, the optical output power emitted by the semiconductor laser alternates above and below the quiescent power $P_Q$, with binary 1's transmitted with an output power $+\Delta P$ above $P_Q$, and binary 0's transmitted $-\Delta P$ below $P_Q$. The output signal follows the ECL voltage signal input to the transceiver, however, due to variations in the slope characteristics between semiconductor lasers, it is necessary to tailor the AC drive current to a particular semiconductor laser to maximize the output power swings $\pm\Delta P$ between 1's and 0's, thereby maximizing the extinction ratio of the transceiver. In tailoring the AC drive current to the laser, it is necessary to determine the magnitude of the current changes $\pm\Delta I$ necessary to achieve the desired change in the output power of the laser $\pm\Delta P$. Once the necessary $\pm\Delta I$ has been determined, the AC drive circuit can be configured to supply an alternating current signal whose magnitude alternates between $I_Q+\Delta I$ and $I_Q-\Delta I$ in response to the ECL voltage data signal supplied by the host device.

In the present invention, the ECL data signal is AC coupled to control circuit 200 through capacitor $C_6$. With the ECL data signal, a signal voltage of 3.2 V indicates a binary 0, and a signal voltage of 4.2 V indicates a binary 1. $C_6$ blocks any DC components of the input voltage signal which may cause interference with the DC drive current supplied by transistor $Q_1$, while allowing the gigabit data signal to pass unhindered. The high frequency voltage signal is applied across resistor $R_8$ and capacitor $C_5$ prior to being input to semiconductor laser $U_4$. $R_8$ comprises the slope compensation resistor, which converts the 1 V ECL voltage signal into an alternating current signal to drive the laser $U_4$.

Figure 2:
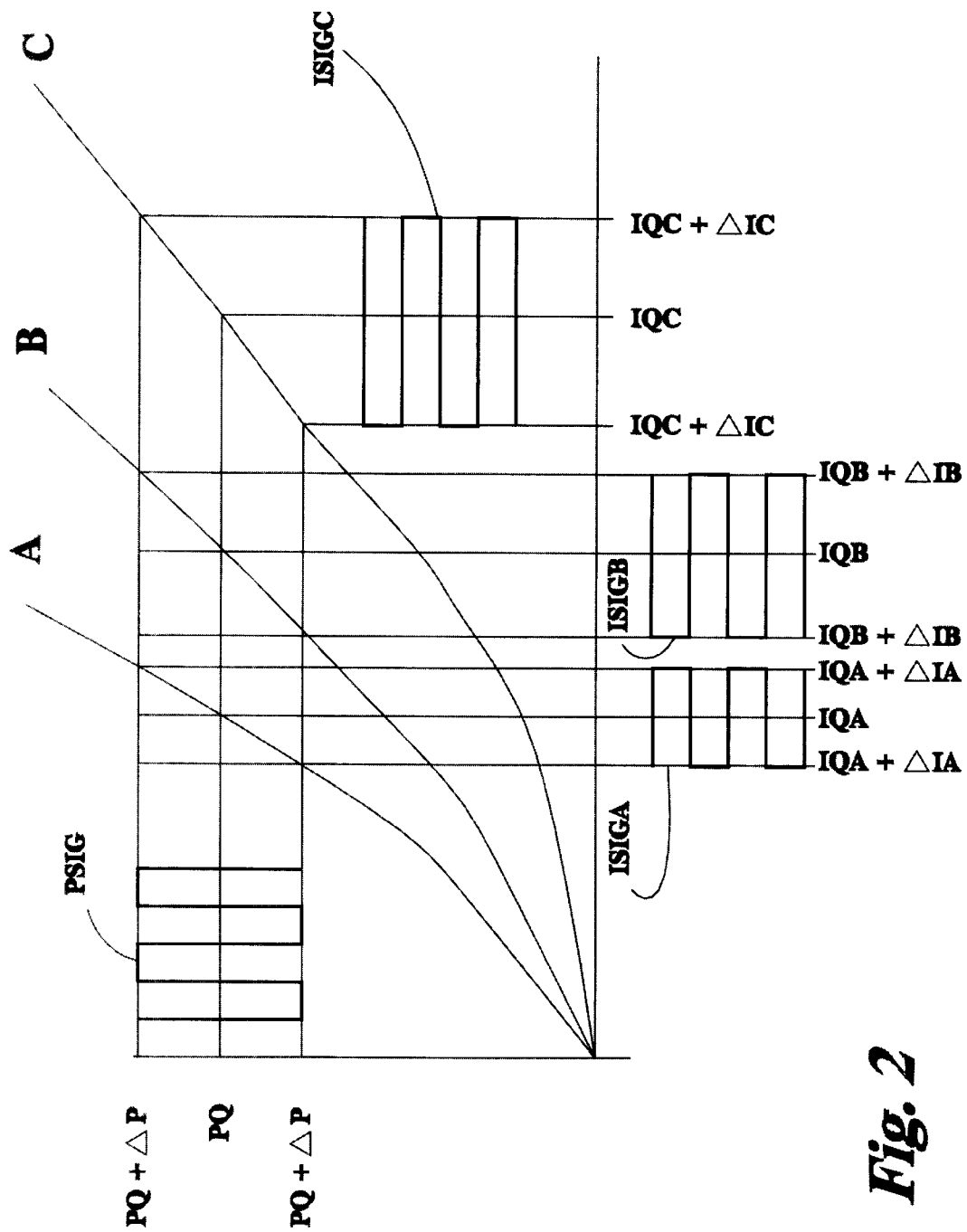
FIG. 2 shows the same P-I curves shown in FIG. 1, but with each device having a separate input current signal $I_{SIGA}$, $I_{SIGB}$, $I_{SIGC}$, applied to each semiconductor laser A, B, and C respectively.

From the perspective of the input data signal, $R_8$ is connected directly in series with semiconductor laser $U_4$. Semiconductor laser $U_4$ has a relatively low internal resistance $R_L$, on the order of 5 Ω to 10 Ω. $R_8$ on the other hand, is comparatively large, on the order of 50–100 Ω. Placing the much larger $R_8$ in series with $U_4$ creates a voltage divider between $R_8$ and $R_L$ such that most of the input voltage signal is dissipated across $R_8$. Since $R_8$ is so much larger than $R_L$, the size of $R_8$ effectively determines the magnitude of the AC signal current that flows to semiconductor laser $U_4$. The resistance of $R_8$ may be manipulated so that the 1 V swing of the ECL data signal will cause a change in the AC drive current $\pm\Delta I$ necessary to cause the desired change in the output power $\pm\Delta P$ emitted by the semiconductor laser $U_4$. Increasing the size of $R_8$ reduces the AC drive current flowing to $U_4$, and lowering the resistance of $R_8$ increases the AC drive current through $U_4$. Thus, for example, referring back to the three semiconductor lasers A, B, and C whose output characteristics are shown in FIG. 2, assume that each semiconductor laser is being operated at the same quiescent power $P_Q$ as shown. Assume further that it is desired that each laser is to have the same extinction ratio $I_Q+\Delta P$ to $I_Q-\Delta P$. As is clear from the drawing, the magnitude of the change in the AC drive current $\pm\Delta I$ necessary to achieve the desired $\pm\Delta P$ will be different for each of the three semiconductor lasers. Clearly, $\pm\Delta I_A$ is smaller than $\pm\Delta I_B$, and $\pm\Delta I_B$ is smaller than $\Delta I_C$. Therefore, returning to FIG. 4, if semiconductor laser A is installed as $U_4$, a relatively large $R_8$ is appropriate due to the favorable slope efficiency of semiconductor laser A. With a relatively large $R_8$, the input ECL voltage signal will generate the relatively small current swing $\pm\Delta I_A$ through $U_4$. Semiconductor laser B has a less favorable slope efficiency than semiconductor laser A. Therefore, if semiconductor laser B is installed as $U_4$, a smaller $R_8$ is appropriate in order to generate the larger current swing $\pm\Delta I_B$. Similarly, since semiconductor laser C has an even less favorable slope efficiency, an even greater current swing $\pm\Delta I_C$ is necessary to achieve the extinction ratio $\pm\Delta P_C$. Therefore, $R_8$ must be reduced even further so that the ECL voltage signal produces the larger current swing $\pm\Delta I_C$. The foregoing example should make clear that the resistive value of $R_8$ may be adjusted to compensate for variations in the output characteristics of the laser regardless of the slope efficiency of the laser.

Referring back to control circuit 200, capacitor $C_5$ acts as a speed up capacitor to compensate for parasitic capacitance within the semiconductor laser. The transceiver of the present invention is intended to operate at gigabit speeds. At such high frequencies the stray capacitance within the semiconductor laser, $C_L$, combines with the series resistance of slope compensation resistor $R_8$ to form an RC time constant which has the effect of increasing the rise and fall time of the current signal input to the laser. Speed up capacitor $C_5$ allows the high frequency components of the input current signal to bypass $R_8$. Therefore, the high frequency transitions of the AC drive current are not affected by the $R_8 C_L$ time constant, and the shape of the input waveform is improved.

In addition to providing APC and laser slope compensation on an optical transceiver, the control circuit of the present invention is configured to facilitate the manufacture of the various printed circuit boards comprising the optoelectronic transceiver. As noted the TOSA is mounted on a separate carrier printed circuit 110 remote from the main transceiver printed circuit board 102. Control circuit 200 allows the variable components associated with APC and laser slope compensation to be mounted separately with the TOSA with a minimal number of electrical connections between the main transceiver printed circuit board 102 and the carrier printed circuit board 110. With the variable components associated with APC and laser slope compensation removed from the main transceiver printed circuit board 102, the remaining board mounted components comprising the transceiver 100 will be identical from one transceiver to another. Such standardization facilitates the manufacturing process for mass producing transceivers.

Figure 5:
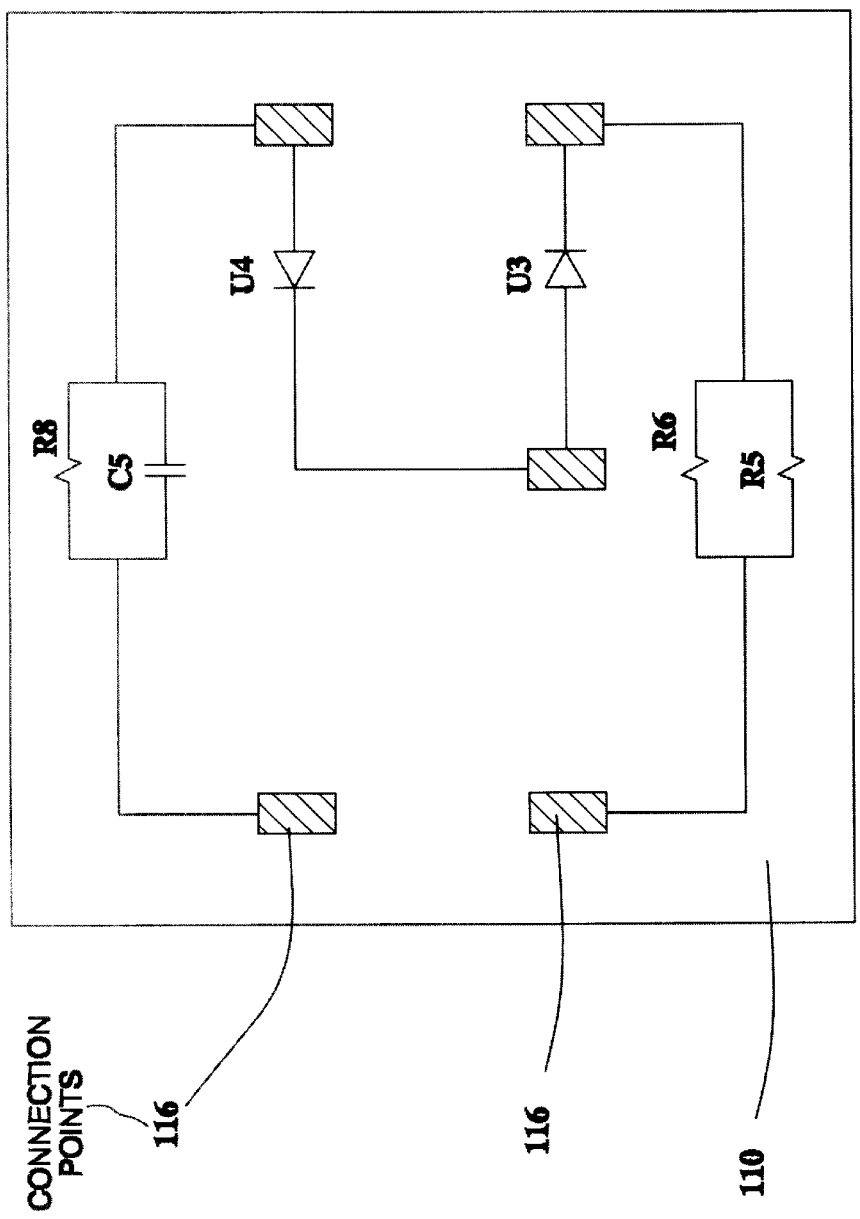
FIG. 5 is a schematic representation of the back side of the carrier printed circuit board to which the TOSA is mounted, including biasing resistors for providing Automatic Power Control and Laser slope compensation.

Employing control circuit 200 allows $R_5$, $R_6$, $R_8$, $U_3$, and $U_4$ all to be mounted on the separate carrier printed circuit board 110 with the TOSA. FIG. 5 schematically represents the components mounted on the carrier printed circuit board 110. Also shown are the connection points 116 where the various signal lines must be connected to the remainder of the control circuit located on the main transceiver printed circuit board 102. As can be seen, the configuration of control circuit 200 requires only 5 connection points between the main transceiver printed circuit board 102 and carrier printed circuit board 110. In the preferred embodiment of the invention these connection points 116 are formed as solder pads which can be soldered to corresponding solder pads formed on the main transceiver printed circuit board 102 as set forth below. Alternate connection methods are also contemplated within the scope of the invention, including, but not limited to wire bonding and through hole connections. In the preferred embodiment the solder pads on the carrier printed circuit board are arranged such that carrier printed circuit board 110 can be brought into perpendicular abutment with the main printed circuit board 102 with the solder pads straddling the horizontal plane of the main printed circuit board 102. Referring back to FIG. 3, corresponding solder pads 118 are formed on the main transceiver printed circuit board 102 opposite solder pads 114. When printed circuit boards 102, 110 are placed in this configuration, fillet shaped solder joints 120 may be formed between the solder pads 116, 118. The fillet shaped solder joints perform two functions. First, the solder joints bond carrier printed circuit board 110 to the main printed circuit board 102. Second, the solder joints provide the electrical connections between the components mounted on carrier printed circuit board 110 and those mounted on the main printed circuit board 102. Though not affected by the configuration of control circuit 200, the ROSA mounted to separate carrier printed circuit board 114 may also be joined to the main printed circuit board 102 in the same manner.

As noted, mounting the variable components on separate carrier printed circuit boards allows the main printed circuit board 102 to be manufactured using high speed automated techniques. Separate TOSA assemblies on the other hand, must be manufactured individually with the variable components individually calibrated to the particular semiconductor laser housed within each individual TOSA. Thus, a large pool of transceiver boards can be manufactured quickly and inexpensively, then stockpiled for later use when they can be joined to normalized TOSA and ROSA assemblies. The resultant optoelectronic transceiver provides both APC and laser slope compensation circuits which are pre-calibrated to the individual output characteristics of the particular semiconductor laser employed as the active optical element.

In the embodiment just described the main transceiver printed circuit board was sized and laid out for a small footprint transceiver package such as a 1×9. The 1×9 package provides a single row of nine contact pins as the electrical interface with the host device, and an SC duplex fiber optic receptacle adjacent the TOSA and ROSA for interfacing with an SC duplex fiber optic connector. A second embodiment of the invention comprises an optoelectronic transceiver housed within a pluggable module such as an extender housing. Rather than a array of contact pins extending from the printed circuit board, the host interface comprises a DB-9 connector for connecting to a mating connector located on the host device. The extender housing is physically larger than most small footprint packages and includes a larger main printed circuit board 102. With the exception of the physical dimensions of the module and the connector interface, the second embodiment is physically very similar to that described in the first embodiment. The primary difference with the second embodiment is the inclusion of a fault latching and fault indication circuit that may be required for some applications.

Figure 6:
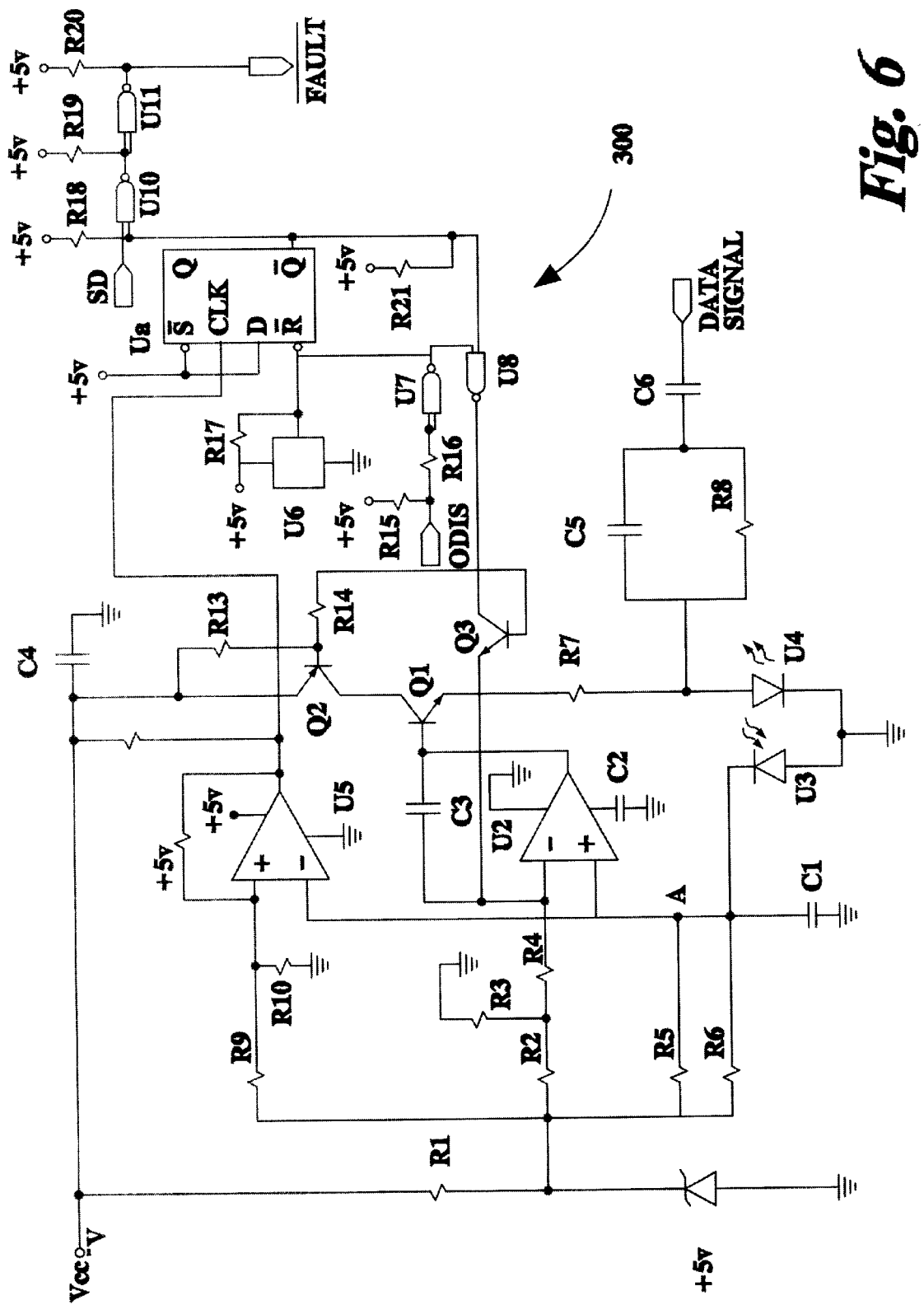
FIG. 6 is a schematic diagram showing an improved control circuit according to a second embodiment of the invention.

FIG. 6 shows a control circuit 300 according to this second embodiment of the invention. In this embodiment APC and laser slope compensation are accomplished in exactly the same manner as in the previous embodiment. Resistor $R_1$ and regulated reference $U_1$ create a regulated 2.5 V reference. Resistors $R_2$ and $R_3$ form a voltage divider, further reducing the 2.5 V reference to provide a 1.25 V reference voltage to the inverting terminal of operational amplifier $U_2$. Photodiode $U_3$ controls the feedback current through resistors $R_5$ and $R_6$. The reverse current through $R_5$ and $R_5$ produces a negative voltage drop across the resistors, establishing a negative feedback voltage reference at node A. Node A is connected to the non-inverting terminal of $U_2$ such that the negative feedback voltage reference established at node A (equal to the regulated 2.5 V reference minus the voltage drop across $R_5$ and $R_6$) is applied thereto. Thus, operational amplifier $U_2$ monitors the feedback voltage drop across $R_5$ and $R_6$ and compares the voltage drop against a known reference, producing an output voltage signal proportional to the voltage difference between the two. As the voltage on the non-inverting terminal sinks lower and lower, indicating more power output from laser $U_4$, the output voltage of $U_2$ becomes less, thereby lowering the base voltage to transistor $Q_1$ and reducing the flow of current to $U_4$. Similarly, as the voltage on the non-inverting terminal of $U_2$ increases, indicating less power being transmitted by $U_4$, the output voltage of $U_2$ increases, thereby increasing the base voltage on transistor $Q_1$ and increasing the current flow to $U_4$. As with the previous embodiment, the size of $R_5$ and $R_6$ can be adjusted in order to establish a quiescent DC drive current at any particular level required by the particular semiconductor laser employed in the place of $U_4$.

As for laser slope compensation, an ECL voltage signal is AC coupled to control circuit 300 through capacitor $C_6$. The AC drive current is trimmed by resistor $R_8$ so that the 1 V swing associated with the input ECL data signal causes an AC current swing in the semiconductor laser input current of sufficient size to generate the desired power swing $\pm\Delta P$ to maximize the extinction ratio of the transceiver. The magnitude of the AC current swings can be adjusted by altering the size of $R_8$. Furthermore, parasitic capacitance within semiconductor laser $U_4$ is compensated for by speed-up capacitor $C_5$.

In addition to the features included within the first embodiment, control circuit 300 further includes laser fault latching circuitry. The laser fault latching circuitry monitors the optical power emitted by $U_4$ to determine whether the output power exceeds safe operating levels for the laser. The excess output power situation is monitored because transmitting an excessive amount of laser power can raise safety issues for personnel working in the vicinity of the optoelectronic transceiver. The low power fault condition need not be monitored since there is no risk of injury to personnel, and a low power failure will become manifest in failed data transmissions.

The fault monitoring circuitry relies on the same feedback circuit comprising photodiode $U_3$ and feedback resistors $R_5$ and $R_6$ established for APC. The negative feedback voltage reference established at node A as the result of the voltage drop across $R_5$ and $R_6$, is input to the inverting terminal of comparator $U_5$. On the non-inverting terminal, the 2.5 V reference created by $R_1$ and regulated reference $U_1$ is further divided between resistors $R_9$ and $R_{10}$. $R_9$ and $R_{10}$ are sized to provide a 1.126 V reference on the non-inverting terminal. Comparator $U_5$ is an open collector device. When the input voltage on the non-inverting terminal exceeds that on the inverting terminal, the output of $U_5$ is pulled up to +5 V by pull-up resistor $R_{12}$. When the non-inverting terminal voltage drops below that of the inverting terminal, the output of comparator $U_5$ is pulled to ground. Thus, when the voltage present at node A exceeds 1.126 volts, the output of comparator $U_5$ will be pulled down to ground potential. This corresponds to normal safe operating conditions for semiconductor laser $U_4$. However, if the control circuit fails to control the output of $U_4$, and the power emitted by $U_4$ increases, the feedback current through photodiode $U_3$ will likewise increase, thereby increasing the voltage drop across $R_5$ and $R_6$. This condition lowers the voltage at node A which is applied to the inverting terminal of $U_5$. When the output power of $U_4$ increases to the point where the voltage applied to the inverting terminal of $U_5$ drops below 1.126 V, indicating that the control loop is out of control, the output of comparator $U_5$ transitions from low to high, switching from near ground potential to near +5 V. The power threshold where this transition occurs represents the maximum output power of semiconductor laser $U_4$ which the transceiver will allow. The output transition from low to high of comparator $U_5$ initiates a Laser Fault condition which disables semiconductor laser $U_4$, thereby providing a safety circuit which protects against excessive laser emissions. Feedback resistor $R_{11}$ adds hysteresis to provide output stability and prevent chattering when the input voltages are near transition.

The output of comparator $U_5$ is connected to the CLK input of D/Q flip-flop $U_9$. Inputs $\overline{S}$ and D of $U_9$ are connected to the +5 V $V_{CC}$. +5 V applied to the $\overline{S}$ input effectively disables the set feature of the flip-flop $U_9$. +5 V applied to the D input of $U_9$ represents a logical 1 applied to the data input of the flip-flop. Thus, when the CLK input transitions from low to high (indicating that a laser fault has been detected) a logic 1 (+5 V) is clocked through to the Q output, and a logic 0 (ground potential) is set on the output $\overline{Q}$. As will be discussed in more detail below, a low $\overline{Q}$ output from flip-flop $U_9$ sets the $\overline{FAULT}$ signal to logic 0, and disables the semiconductor laser $U_4$.

The remaining input to flip-flop U9 is the $\overline{R}$ input. When this input is set low (ground potential) a logic 0 is immediately set on output Q and a logic 1 (+5 V) is set on $\overline{Q}$. The circuitry providing the signal for this input includes a power monitor chip $U_6$ and an optics disable signal ODIS supplied by the host device. The power monitor chip $U_6$ generally supplies a logic 1 to the $\overline{R}$ input. However, when the transceiver is initially powered up, either by initially powering up the entire system, or by hot plugging the transceiver into an already operating system, $U_6$ supplies a temporary logic 0 to the fault latching circuit. The low pulse serves two purposes. First, by providing a logic 0 input to $\overline{R}$, the pulse resets flip-flop $U_9$, setting output Q to logic 0 and $\overline{Q}$ to logic 1, thereby unlatching any previous laser fault. Second, the low pulse from $U_6$ provides a logic 0 input to NAND gate $U_8$. As will be discussed forthwith, a logic 0 on either input to $U_8$ disables semiconductor laser U4. Therefore, the low pulse from $U_6$ disables semiconductor laser $U_4$ during the duration of the pulse, and clears the fault output $\overline{Q}$ of flip-flop $U_9$.

The ODIS signal is generated by the host device external to the transceiver itself. When the ODIS signal is set to a logic 1 the semiconductor laser is disabled, but a fault signal is not generated. Within control circuit 300, the ODIS signal is connected to both inputs of NAND gate $U_7$, such that $U_7$ simply inverts the ODIS signal. The output of NAND gate $U_7$ is connected with the output of power monitor chip $U_6$, and together the two are input to the $\overline{R}$ input of flip-flop $U_9$, and NAND gate $U_8$. Thus, the inverted ODIS signal affects the laser disable circuit in the same manner as the logic 0 pulse supplied by the power monitor chip $U_6$ on power up. The ODIS signal at logic 1 indicates that the host device is commanding the transceiver to disable the semiconductor laser $U_4$. In such case, the inverted ODIS signal output from $U_7$ provides a logic 0 input to R of flip-flop $U_9$ which resets the flip-flop, setting output Q to logic 0 and $\overline{Q}$ to logic 1, while simultaneously providing a logic 0 to the input of NAND gate $U_8$ which disables the laser $U_4$.

The output of NAND gate $U_8$ acts to disable semiconductor laser $U_4$ whenever the output of $U_8$ is a logic 1. The output of $U_8$ will be a logic 1 if either of its two inputs are at logic 0. The first input to $U_8$ is connected to the inverted ODIS signal and the output of power monitor chip $U_6$. As discussed above, this input will be logic 0 whenever either the initial power up low pulse is delivered by $U_6$ or the ODIS signal is set to logic 1 by the host device. The second input to NAND gate $U_8$ is connected to the $\overline{Q}$ output of flip-flop $U_9$. This input will be logic 0 whenever the CLK input to $U_9$ transitions from low to high indicating the presence of a laser fault. Thus, in addition to the conditions described above regarding the power monitor chip $U_6$, and the ODIS signal, the output of NAND gate $U_8$ will also disable semiconductor laser $U_4$ when the laser fault circuitry detects excess power emitted from the laser.

NAND gate $U_8$ is an open drain CMOS device so that when the output signal is logic 0, the output is effectively pulled down to ground potential. When the output is a logic 1, the device is effectively an open circuit, and the output signal is pulled up to +5 V through resistors $R_{13}$ and $R_{14}$. When the output of $U_8$ is low, the +5 V $V_{CC}$ is divided between $R_{13}$ and $R_{14}$, such that the base of transistor $Q_2$ is biased at approximately +3.0 V, and the emitter of $Q_2$ is held at +5 V. In this condition $Q_2$ sources current to laser diode $U_4$ through $Q_1$, thereby enabling the laser. When a fault condition is present, or when the laser is to be disabled during a power up condition or because the optics disable signal ODIS has been set by the host device, the output of $U_8$ is pulled up to +5 V, and the base voltage applied to transistor $Q_2$ approximately equals the emitter voltage. Under these conditions $Q_2$ is switched off, and ceases to supply current to semiconductor $U_4$, thereby disabling the semiconductor laser $U_4$.

The output of $U_8$ is also connected to the base and collector of transistor $Q_3$. In this arrangement $Q_3$ acts as a diode with the direction of easy current flow pointing away from $U_8$. $Q_3$ works in conjunction with $Q_2$ to disable the semiconductor laser $U_4$. When the output of $U_8$ is high, logic 1, $Q_3$ passes the +5 V logic signal to the inverting terminal of $U_2$. This raises the input reference voltage applied to the inverting terminal of operational amplifier from +1.25 V to +5.0 V. The maximum voltage supplied to the non-inverting terminal of $U_2$, on the other hand, is +2.5 V. Therefore, with the output of $U_8$ high, there will exist a large negative voltage difference on the input terminals of operational amplifier $U_2$. This large negative voltage differential will cause the output voltage of $U_2$ to drop to near 0 V. This lowers the base voltage applied to transistor $Q_1$, thereby switching off the current flow through $Q_1$ to semiconductor laser $U_4$. Transistor $Q_3$ prevents a runaway condition from occurring when the semiconductor $U_4$ is re-enabled. Without $Q_3$, if transistor $Q_2$ were to interrupt current flow to semiconductor laser $U_4$ without raising the reference voltage supplied to $U_2$, the immediate effect would be to halt the emission of optical power from the laser. However, the loss in output power would simultaneously result in the loss of feedback energy striking the power monitoring PIN diode $U_3$. The APC circuit would immediately try to compensate for the lost optical power by raising the base voltage on transistor $Q_1$ to allow more current through $Q_1$ to drive $U_4$. Very quickly the base voltage to $Q_1$ would be raised to near +5 V trying to supply more current to $U_4$ in an attempt to resurrect the laser output power. Re-enabling the laser under these conditions would result in $Q_1$ immediately sourcing a very large current as soon as transistor $Q_2$ becomes conductive. The large input current would immediately result in excess power emitted by $U_4$, and the fault circuitry would immediately fault out again. By raising the reference voltage to $U_2$ and thereby lowering the base voltage to transistor $Q_1$ during those periods when the semiconductor laser $U_4$ is disabled, this runaway condition is avoided.

Finally, control circuit 300 provides a logic signal to indicate when a laser fault has been detected. $\overline{FAULT}$ is an active low signal such that a logic 0 indicates the presence of a fault. The $\overline{FAULT}$ signal is derived from the $\overline{Q}$ output of flip-flop $U_9$ and a signal detected signal, SD. Both signals are input to NAND gate $U_{10}$. Thus, if either signal is logic 0, $U_{10}$ outputs a logic 1. The output of $U_{10}$ is connected to both inputs of NAND gate $U_{11}$, so that $U_{11}$ merely inverts the output of $U_{10}$. The output of $U_{11}$ comprises the $\overline{\text{FAULT}}$ signal. If either SD or $\overline{Q}$ are low, $\overline{\text{FAULT}}$ will be low, indicating the presence of a fault.

Thus, control circuit 300 provides a transceiver control circuit including Automatic Power Control, laser slope compensation, and laser fault latching. As with the first embodiment, control circuit 300 provides these features in a manner which allows variable components such as the feedback resistors $R_5$ and $R_6$, and the slope compensation resistor $R_8$ to be mounted on a separate carrier printed circuit board, requiring only a minimal number of connection points between the main transceiver printed circuit and the carrier printed circuit board. This allows standard boards to be mass produced separately, and TOSA assemblies can be assembled with the variable components and actively tested to determine the optimal value for all of the variable components.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

What is claimed is:

1. An optical transmitter configured for efficient mass production, comprising:
    a first printed circuit board of an optical transmitter for mounting variable components, said first printed circuit board (PCB) comprising:
        a semiconductor laser;
        a slope compensation resistor for normalizing output of the semiconductor laser to a predetermined linear characteristic;
    a second printed circuit board (PCB) of an optical transmitter for mounting standardized components comprising:
        an alternating current (AC) laser current driver circuit; and
        a direct current (DC) laser current bias circuit.

2. The optical transmitter of claim 1, having less than six electrical connections between the first and second printed circuit boards.

3. The optoelectronic transmitter of claim 1, further comprising laser fault latching circuitry on the second printed circuit board, the laser fault latching circuitry configured to monitor the output power emitted by the semiconductor laser, and preventing current flow to the semiconductor laser when excess output power is detected by the photodiode.

4. The optoelectronic transmitter of claim 3 having five or fewer electrical connections between the first and second printed circuit boards.

5. The optoelectronic transmitter of claim 1, wherein electrical connections are provided by mutually opposed pairs of solder pads formed on the first and second printed circuit boards with solder joints formed therebetween.

6. The optoelectronic transmitter of claim 1, further comprising first and second solder pad arrays formed on the first and second printed circuit boards, the solder pads being arranged such that said first and second printed circuit boards being placed in approximate perpendicular abutment, the solder pads formed on the first printed circuit board align adjacent to the solder pads formed on the second printed circuit board, and solder joints are formed in the angular space between the solder pads.

7. The optoelectronic transmitter of claim 1, further comprising a control circuit for driving the semiconductor laser, the control circuit including automatic power control for establishing a stable quiescent operating current to said semiconductor laser such that said semiconductor laser emits an optical signal having stable predetermined quiescent output power.

8. The optoelectronic transmitter of claim 7 wherein the quiescent output power is determined by the resistive value of the optical power feedback resistor mounted on the first printed circuit board, and wherein a voltage drop across the optical power feedback resistor is proportional to the optical power emitted by said semiconductor laser.

9. The optoelectronic transmitter of claim 1, wherein the optical power feedback resistor comprises a polymer thick film resistor screened onto a surface of the first printed circuit board.

10. The optoelectronic transmitter of claim 1, further comprising a control circuit for driving the semiconductor laser, the control circuit including laser slope compensation circuitry for normalizing the output characteristics of the semiconductor laser to a predetermined linear operating range, the laser slope compensation circuitry providing an alternating input current to the semiconductor laser corresponding to a voltage data signal input to the module, the alternating input current having a peak-to-peak magnitude calibrated to drive the semiconductor laser to emit an optical signal having a normalized peak-to-peak output power level.

11. The optoelectronic transfer of claim 10 wherein the peak-to-peak magnitude of the alternating input current is established by resistive value of the slope compensation resistor.

12. The optoelectronic transmitter of claim 11 wherein the slope compensation resistor comprises a polymer thick film resistor screened onto a surface of the first printed circuit board.

13. The optoelectronic transmitter of claim 1, further comprising a control circuit for driving the semiconductor laser by supplying an input drive current to said semiconductor laser, the control circuit including laser fault circuitry configured to monitor the output power of the semiconductor laser, the laser fault circuitry acting to disable the semiconductor laser whenever the optical output power emitted by the semiconductor laser exceeds a predetermined threshold, and providing an indication that a laser fault has occurred.

14. The optoelectronic transmitter of claim 1, wherein the optical output power emitted by the semiconductor laser is monitored by a laser feedback circuit, the laser feedback circuit including the feedback resistor mounted on the first printed circuit board, wherein a voltage drop is established across the optical power feedback resistor proportional to the optical power emitted by the semiconductor laser.

15. The optoelectronic transmitter of claim 14 wherein the laser fault circuitry acts to disable the semiconductor laser by interrupting the input drive current flowing thereto.

16. The optoelectronic transmitter of claim 15 wherein the second printed circuit board includes a single row of nine contact pins forming an electrical interface, and an SC fiber optic receptacle for receiving an SC duplex connector.

17. The optical transmitter of claim 1, the first PCB further comprising:
    a speed up capacitor connected in parallel with the slope compensation resistor.

18. The optical transmitter of claim 1, the first PCB including a transmit optical sub-assembly (TOSA).

19. The optical transmitter of claim 1, wherein the first PCB is mounted perpendicular to the second PCB.

20. The optical transmitter of claim 19, wherein the first PCB includes a transmit optical sub-assembly (TOSA) mounted perpendicular to the first PCB.

21. An optical transmitter comprising:
a first printed circuit board for mounting variable components; and
a second printed circuit board for mounting standardized components;
a transmit optical sub-assembly including a semiconductor laser mounted to the first printed circuit board;
electronic components for driving the semiconductor laser mounted on the second printed circuit board, including output power stabilizing circuitry; and
a feedback resistor mounted on the first printed circuit board providing a feedback voltage to the power stabilizing circuitry inversely proportional to the optical power emitted by the semiconductor laser.

22. The optoelectronic transmitter of claim 21 further comprising a laser output normalizing resistor mounted on the first printed circuit board.

23. A control circuit for controlling the optical power emitted by a semiconductor laser transmitter, the control circuit comprising:
a first printed circuit board (PCB) having a transmit optical subassembly (TOSA) including a semiconductor laser, wherein the first PCB receives variable laser output normalizing components;
a second PCB for receiving standardized electronic for driving the semiconductor laser;
a reference circuit configured to provide a reference voltage;
a monitor circuit configured to provide a feedback voltage inversely proportional to the optical power emitted by said semiconductor; and
a DC current source on the first PCB for supplying a quiescent input current to said semiconductor laser, the current source supplying a current level determined by the magnitude of the feedback voltage relative to the reference voltage.

24. The control circuit of claim 23 wherein the monitor circuit comprises a reverse biased PIN photodiode connected in series with an optical power feedback resistor, the PIN photodiode being located such that a portion of the optical power emitted by said semiconductor laser strikes a surface of the PIN photodiode, modulating a reverse current flowing therethrough.

25. The control circuit of claim 23 further comprising:
an operational amplifier on the first PCB for comparing the feedback voltage against the reference voltage, and providing an output voltage proportional to the voltage difference therebetween; and
an NPN transistor on the first PCB having the collector connected to a supply voltage, the base connected to the output of the operational amplifier, and the emitter supplying current to said semiconductor laser.

26. The control circuit of claim 23 further comprising:
a reverse biased PIN photodiode on the first PCB connected in series with an optical power feedback resistor, the PIN photodiode being located such that a portion of the optical power emitted by said semiconductor laser strikes a surface of the PIN photodiode, modulating a reverse current flowing therethrough;
said optical power feedback resistor on the first PCB connected in series with the PIN photodiode, the reverse current through the PIN photodiode generating a voltage drop across the optical power feedback resistor and establishing the feedback voltage;
an operational amplifier on the second PCB for comparing the feedback voltage against the reference voltage, and providing an output voltage proportional to the voltage difference therebetween; and
an NPN transistor on the second PCB having the collector connected to a supply voltage, the base connected to the output of the operational amplifier, and the emitter supplying current to said semiconductor laser.

27. The control circuit of claim 23 further comprising a data circuit on the first PCB for supplying a data current signal to said semiconductor laser.

28. The control circuit of claim 27 wherein the data circuit comprises a slope compensation resistor connected in parallel with a speed up capacitor on the first PCB between an input data signal and said semiconductor laser.

29. The optical transmitter of claim 27, wherein the TOSA is mounted parallel to the second PCB.

30. A fault detecting and latching circuit for an optoelectronic transmitter employing a semiconductor laser as the active optical element thereof, the fault detecting circuit comprising:
a first printed circuit board (PCB) having a transmit optical sub-assembly (TOSA) including a semiconductor laser;
a second PCB for mounting standardized electronic components for driving the semiconductor laser;
a reference circuit on the first PCB configured to provide a reference voltage;
a monitor circuit on the first PCB configured to provide a monitor voltage proportional to the optical power emitted by said semiconductor laser;
means on the second PCB for comparing the monitor voltage against the reference voltage and generating a fault signal when the monitor voltage drops below the reference voltage;
memory means on the second PCB for retaining the fault signal until the memory device is deliberately reset; and
disabling means on the second PCB for preventing said semiconductor laser from emitting optical energy when the fault signal is present.

31. The fault detecting and latching circuit of claim 30 wherein the means for comparing comprises a comparator.

32. The fault detecting and latching circuit of claim 30 wherein the memory means comprises a flip-flop.

33. The fault detecting and latching circuit of claim 32 wherein the flip-flop comprises a D-Q flip-flop.

34. The fault detecting and latching circuit of claim 30 wherein the disabling means comprises a transistor which acts to block current flow to said semiconductor laser when the fault signal is present.

* * * * *